(12) United States Patent
Beecher

(10) Patent No.: US 7,702,480 B2
(45) Date of Patent: Apr. 20, 2010

(54) MANUFACTURING TEST AND PROGRAMMING SYSTEM

(76) Inventor: David Beecher, 3504 289th Ave. NE., Redmond, WA (US) 98053

( * ) Notice: Subject to any disclaimer, the term of this patent is extended or adjusted under 35 U.S.C. 154(b) by 104 days.

(21) Appl. No.: 11/718,715

(22) PCT Filed: Nov. 7, 2005

(86) PCT No.: PCT/US2005/040369

§ 371 (c)(1),
(2), (4) Date: May 4, 2007

(87) PCT Pub. No.: WO2006/052934

PCT Pub. Date: May 18, 2006

(65) Prior Publication Data

US 2008/0103619 A1    May 1, 2008

Related U.S. Application Data

(60) Provisional application No. 60/625,286, filed on Nov. 5, 2004.

(51) Int. Cl.
*G01R 31/00* (2006.01)
*G01M 19/00* (2006.01)
(52) U.S. Cl. ........................ 702/119; 702/120; 702/121; 702/122
(58) Field of Classification Search ......... 702/119–124, 702/179–190; 714/742; 361/42; 700/108–109
See application file for complete search history.

(56) References Cited

U.S. PATENT DOCUMENTS

2005/0273685 A1* 12/2005 Sachdev et al. ............. 714/742
2005/0275981 A1* 12/2005 Power et al. ................. 361/42

* cited by examiner

*Primary Examiner*—Eliseo Ramos Feliciano
*Assistant Examiner*—Phuong Huynh

(57) ABSTRACT

A manufacturing test and programming system (100) is presented including providing a PCB tester (108), providing an in-system programmer (102) electrically attached to the PCB tester (108), mounting a device under test (114) having a programmable device (116) attached thereon and programming the programmable device (116) with the in-system programmer (102).

16 Claims, 2 Drawing Sheets

MANUFACTURING TEST AND PROGRAMMING SYSTEM

CROSS-REFERENCE TO RELATED APPLICATION(S)

This application claims the benefit of U.S. Provisional Patent Application Ser. No. 60/625,286 filed Nov. 05, 2004 and the subject matter thereof is hereby incorporated herein by reference thereto.

TECHNICAL FIELD

The present invention relates generally to printed circuit board test systems, and more particularly to a system for printed circuit board programming and test.

BACKGROUND ART

Programmable integrated circuits have applications in all manner of devices. Many of the commodity electronic devices that we take for granted, such as cellular telephones, PDA's, music players and radios, have at least one programmable component among the circuitry on their printed circuit board (PCB). In the manufacturing of millions of these electronic devices yearly, each of the programmable integrated circuits must be programmed and tested with the rest of the components on the board. With high volume manufacturing flow, the interaction with a single programmable integrated circuit must be straight forward and fast. The device must be programmed and verified in as short a time as possible, with minimal interaction involving the in-circuit tester (ICT).

Early generations of PCB in-circuit testers used a functional testing methodology where test signals were applied at various circuit inputs and output signals were monitored by the ICT. Such functional testing suffers from at least two limitations. First, it is difficult to formulate thorough and effective test programs suitable for gathering information concerning a variety of circuits designated for test because of the unique nature of individual circuits. Second, fault isolation to a particular element on a PCB or other circuit assembly having many circuit elements requires an accurate operational understanding of the assembled circuit.

It is difficult to analyze sequential devices. That is devices that require a series of signal changes at the input before any change is detected on the output. The complicated nature of the relationships between test signals applied at circuit inputs and the resulting signals at the outputs of the individual sequential device makes it extremely difficult to determine the signals that must be applied at the circuit assembly inputs to "initiate" each sequential device in the circuit assembly. As a result of the limitations of functional testing, many circuit assembly testers utilize a technique known as in-circuit testing in which individual circuit components (both sequential and non-sequential) are tested via in-circuit application of test signals at the inputs of each component and concurrent observation of resulting output signals at the various outputs of each component.

For simple circuits, testing is often accomplished by applying appropriate voltages to circuit nodes to test for short or open circuits. Circuit nodes are any equipotential circuit element, such as, but not limited to, connecting wires, printed circuit board traces, edge connectors, and connector pins. Functional testing methods as described above may also be performed where the tester and/or test equipment has sufficient knowledge of circuit operation. As circuit assemblies become more complex, circuit testers have to adapt in order to accurately and thoroughly test these complex assemblies. With the added complexity and density due to miniaturization, it has become more important, and more difficult, to thoroughly test circuit assemblies.

Generally, today's automated circuit assembly tests include a host computer running a test program (i.e., a software application) that operates a test interface that communicates various steady-state voltages and test signals between test equipment and the device under test (DUT). The test interfaces may access the various test ports as well as other circuit nodes on the DUT. The test equipment may include numerous resources, such as voltage drivers, receivers, relays, and test pins arranged to engage appropriate locations of the DUT. The drivers and receivers are alternately connected and may be jointly connected in some embodiments (as for bidirectional data busses) in a systematic and clocked sequence to various nodes of the DUT. The drivers and receivers may be connected via relays and test pins that contact various circuit assembly nodes, giving the test equipment control of the embedded circuitry.

When the embedded circuitry includes programmable devices, the test program can become very complicated and spend an inordinate amount of time managing the programming and test process for a single device. If the in-circuit tester is engaged in programming a single embedded integrated circuit, all of the other nodes of the DUT must be held at a neutral state. Once the programmable device has been programmed, the entire DUT must be put into a state that will allow positive testing of the programmable device as well as its surrounding circuits. As a result the in-circuit tester programs are significantly longer and require more resources within the in-circuit tester to execute properly. The overwhelming nature of this problem caused manufacturers to program all programmable devices on another station prior to the assembly of the PCB or assemble sockets for later insertion of a programmed device. This option causes double handling of all PCB's and an extra set of programming stations in the manufacturing flow.

Thus, a need still remains for a manufacturing test system that can reduce tester resources and speed the test time for PCB's. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a manufacturing test and programming system including providing a PCB tester, providing an in-system programmer electrically attached to the PCB tester, mounting a-device under test having a programmable device attached thereon and programming the programmable device with the in-system programmer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
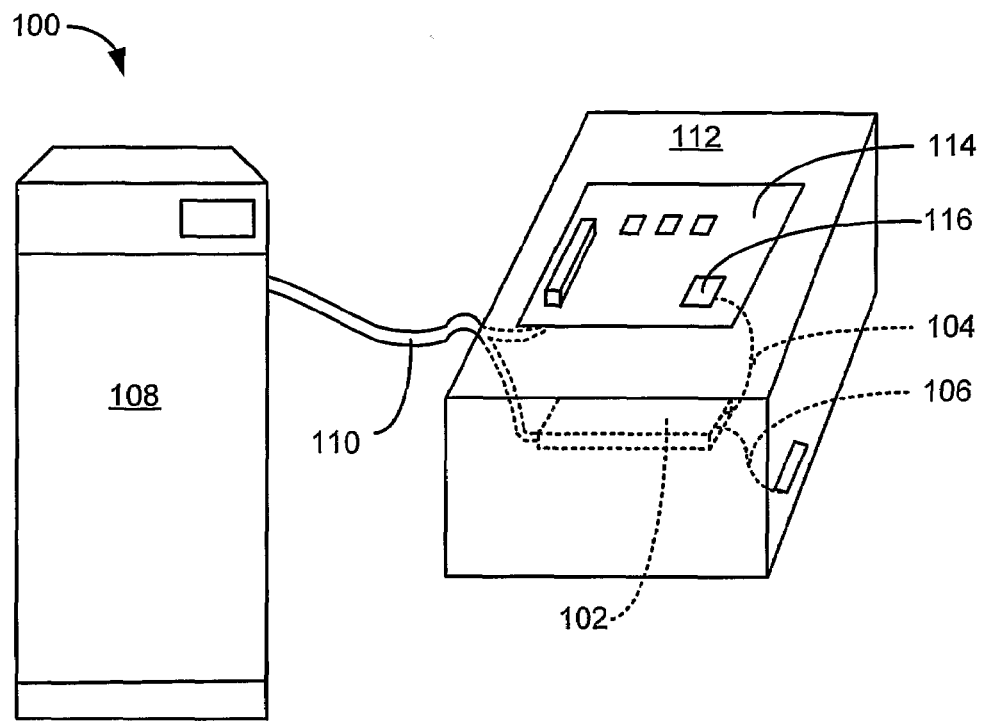
FIG. 1 is a plan view of a manufacturing test and programming system in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. Also where multiple embodiments are disclosed and described, having some features in common, for clarity and ease of illustration, description, and comprehension thereof, similar and like features one to another will ordinarily be described with like reference numerals.

The term "horizontal" as used herein is defined as a plane parallel to the conventional plane or surface of the device under test (DUT) board, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Referring now to FIG. 1, therein is shown a plan view of a manufacturing test and programming system 100 in an embodiment of the present invention. The manufacturing test and programming system 100 includes an in-system programmer 102 (ISP) having an ISP cable 104 and a network interface cable 106. The manufacturing test and programming system 100 also includes a PCB tester 108, a tester cable 110, a tester station 112, and a device under test 114, such as a PCB, having a programmable device 116.

The PCB tester 108 sends test data and control information through the tester cable 110 to the device under test 114 mounted on the tester station 112. The tester station 112 is the receiving platform for the device under test 114. A series of positioned probes on the tester station 112 electrically contact the nodes of the device under test 114 for test analysis. The programmable device 116, such as a field programmable gate array (FPGA), mounted on the device under test 114, must be programmed with characterization data in order to implement the design function for the device under test 114. The PCB tester 108 manages the initiation of the programming operation, but has no direct interaction with the programmable device 116. The programming operation and verification of the programmable device 116 is executed by the in-system programmer 102 without the assistance or control of a host computer.

The in-system programmer 102 is configured to program an instance of the programmable device 116 in the device under test 114. The programming operation is performed by loading characterization data into the programmable device 116. The characterization data causes the programmable device 116 to execute the designed function. If there are multiple instances of the programmable device 116 or different devices that require programming, an array of the in-system programmer 102 can be configured within the tester station 112. Each instance of the in-system programmer 102 is configured to autonomously program an instance of the programmable device 116 with specific characterization data for the logic function implemented in that instance of the programmable device 116.

The in-system programmer 102 is configured via the network interface cable 106. Specific configuration information for the target version of the programmable device 116 is downloaded to the in-system programmer 102. In the processing of the device under test 114, the PCB tester 108 initiates the in-system programmer 102 then exercises other areas of the device under test 114. The PCB tester 108 returns the focus to the in-system programmer 102 for an indication that the process was completed and the programmable device 116 was successfully programmed. The in-system programmer 102 indicates pass or fail to the PCB tester 108 through the tester cable 110. If the programmable device 116 was successfully programmed, the PCB tester 108 can verify the programmable device 116. If the programmable device 116 was not successfully programmed, the in-system programmer 102 indicates fail to the PCB tester 108 indicating the board may be removed and the next board becomes the device under test 114. The programming and test of the programmable device 116 occurs in the test phase of the PCB manufacturing, reducing the amount of time that the device under test 114 must remain on the tester station 112.

Figure 2:
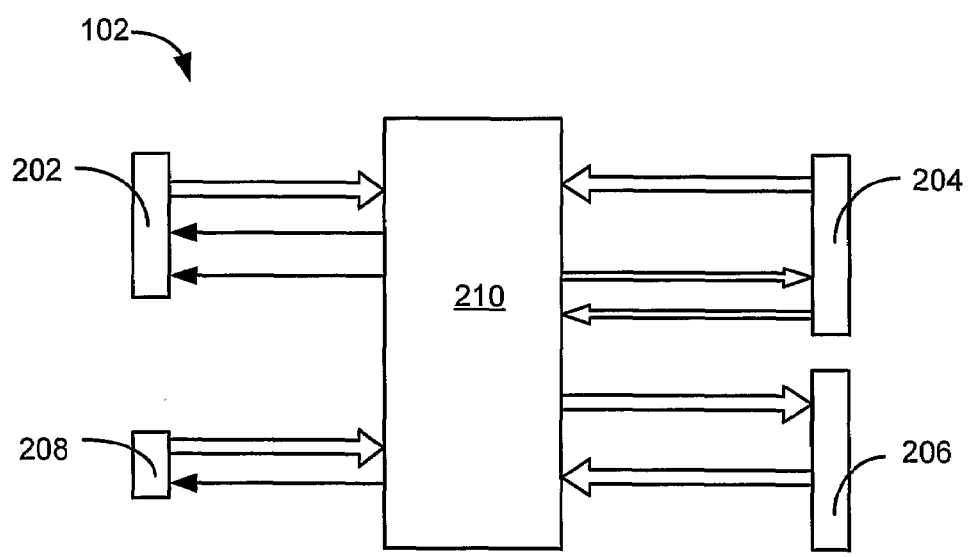
FIG. 2 is a block diagram of the in-system programmer of FIG. 1.

Referring now to FIG. 2, therein is shown an block diagram of the in-system programmer 102 of FIG. 1. The block diagram depicts the communication paths into and out of the in-system programmer 102. The communication paths include a PCB tester interface 202, an ISP interface 204, a network interface 206, a serial protocol interface 208 and a core logic 210. The PCB tester interface 202 contains the START signal that allows the PCB tester 108 to initiate the programming operation and await the pass or fail response. The PCB tester interface 202 attaches to the tester cable 110 of FIG. 1. The ISP interface 204 attaches to the ISP cable 104 of FIG. 1. The ISP interface 204 is the primary interface for programmable devices that support an advanced interface, such as a USB interface.

The network interface 206 attaches to the network interface cable 106 of FIG. 1. The network interface 206 is used to set-up programming information and timing requirements within the in-system programmer 102 of FIG. 1. Depending on the type and vendor of the programmable device 116, the communication style, such as universal serial bus (USB), serial peripheral interface (SPI) or joint test action group (JTAG), and timing requirements could be different. The network interface 206 enables the test system controller (not shown) to configure the in-system programmer 102, of FIG. 1, appropriately to handle the programming task. The specific configuration for the programmable device 116, of FIG. 1, is downloaded through the network interface 206 and stored in the core logic 210.

The network interface 206 also supports an ID feature for operating an array of the in-system programmer 102, of FIG. 1. One of the lines of the network interface 206 is pulse width modulated by the first instance of the in-system programmer 102, of FIG. 1, and sent to the subsequent instance of the in-system programmer 102, of FIG. 1. The in-system programmer 102, of FIG. 1, that receives the signal measures the pulse width, translates the width to an array address, increases the pulse width by a fixed amount and sends the pulse width modulated signal to the next instance of the in-system programmer 102, of FIG. 1, in the array. This process is repeated until all instances in the array have network addresses.

Some of the programmable devices 116, of FIG. 1, may not be large enough to support an advanced interface, such as the USB interface, so the in-system programmer 102, of FIG. 1, has the serial protocol interface 208 as well. The serial protocol interface 208 supports commonly used serial interfaces, such as SPI and JTAG. These serial protocols can be used to program smaller devices.

Figure 3:
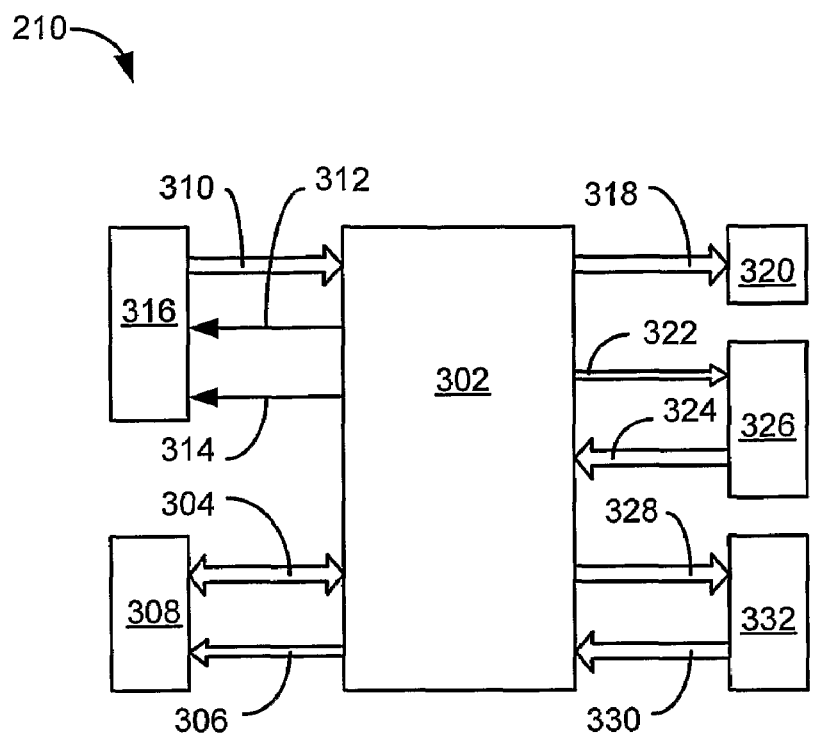
FIG. 3 is a block diagram of the core logic as shown in FIG. 2.

Referring now to FIG. 3, there in is shown a block diagram of the core logic 210 as shown in FIG. 2. The block diagram depicts a control device 302, such as a microprocessor, having a memory address/data bus 304 and memory control lines 306, a memory device 308, an ICT input bus 310, a PASS line 312, a FAIL line 314, optical isolators 316, an LED bus 318, light emitting diodes 320, an ISP programming bus 322, an ISP status bus 324, an ISP connector 326, a network TX bus 328, a network RX bus 330 and line drivers 332.

In a set-up phase, the core logic 210 receives communication parameters and data through the line drivers 332 and the network RX bus 330. The control device 302 uses the communication parameters to establish the appropriate programming path and timing for the programmable device 116, of FIG. 1, that has been targeted. The control device 302 stores the data, used to configure the programmable device 116, in the memory device 308, such as a non-volatile memory, by manipulating the memory address/data bus 304 and activating the memory control lines 306. The control device 302 sends status across the network TX bus 328 through the line drivers 332. The core logic 210 is now ready to actively program the programmable device 116, of FIG. 1. The power to the in-system programmer 102, of FIG. 1, can be removed without losing the configuration data stored in the memory device 308 for the programmable device 116, of FIG. 1.

In a programming phase, the PCB tester 108, of FIG. 1, activates the PCB tester interface 202, of FIG. 2. The optical isolators 316 replicate the information on the PCB tester interface 202, of FIG. 2, on the ICT input bus 310. The ICT input bus 310 contains addressing information, to select one of an array of the in-system programmers 102, of FIG. 1, a RESET line and a START line. If the address matches the set-up that was performed over the network and the RESET line is de-asserted, the START line assertion will cause the core logic 210, of FIG. 2, to start the operation. The control device 302 retrieves the data from the memory device 308 and transfers the data through the ISP programming bus 322 and the ISP connector 326. At the end of the data transfer a verification step causes programming status to be returned through the ISP connector 326 and the ISP status bus 324. The control device 302, upon receiving the status from the ISP status bus 324, communicates that status to the PCB tester 108, of FIG. 1, by activating the PASS line 312 or the FAIL line 314.

The control device 302 reflects the status of the ICT input bus 310, the PASS line 312, the FAIL line 314 and a network activity indicator by activating corresponding lines on the LED bus 318 and illuminating the corresponding set of the light emitting diodes 320. This status can be enabled or disabled in the set-up phase. The PCB tester 108 initializes the core logic 210 by asserting the RESET line in the ICT input bus 310.

Figure 4:
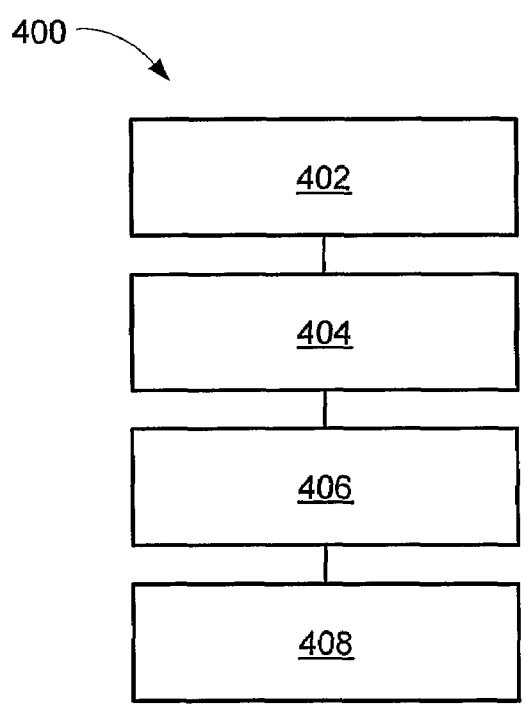
FIG. 4 is a flow chart of a system for the manufacturing test and programming system in an embodiment of the present invention.

Referring now to FIG. 4, therein is shown a flow chart of a system 400 for the manufacturing test and programming system in an embodiment of the present invention. The system 400 includes providing a PCB tester in a block 402; providing an in-system programmer electrically attached to the PCB tester in a block 404; mounting a device under test having a programmable device attached thereon in a block 406; and programming the programmable device with the in-system programmer in a block 408.

In greater detail, a method to provide a manufacturing test and programming system, according to an embodiment of the present invention, is performed as follows:
1. Providing a PCB tester electrically connected to a tester station. (FIG. 1)
2. Electrically attaching an in-system programmer, mounted in the tester station, to the PCB tester. (FIG. 1)
3. Configuring the in-system programmer to communicate with a programmable device. (FIG. 1)
4. Mounting a device under test having the programmable device attached thereon. (FIG. 1)
5. Utilizing an ISP cable for the in-system programmer to program the programmable device. (FIG. 1)

It has been discovered the that printed circuit board manufacturing process can be dramatically shortened by utilizing the in-system programmer to program programmable devices mounted on the printed circuit board. This approach to PCB manufacturing alleviates the need for an operator to pre-program the programmable devices and the requirement for the ICT to host the programming operation.

It has been discovered that the present invention thus has numerous aspects.

An aspect is that the present invention can simplify the task for the in-circuit tester, thereby reducing the amount of resources and time required to test printed circuit boards.

Another aspect is that the in-system programmer can meet the timing requirements of a single programmable device allowing a shortened programming time.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the manufacturing test and programming system method and apparatus of the present invention furnish important and heretofore unknown and unavailable solutions, capabilities, and functional aspects for testing printed circuit boards while programming the programmable devices mounted thereon. The resulting processes and configurations are straightforward, cost-effective, uncomplicated, highly versatile and effective, can be implemented by adapting known technologies, and are thus readily suited for efficiently and economically manufacturing printed circuit boards having programmable devices mounted thereon.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A manufacturing test and programming method implemented on a tester station, the method comprising:
   receiving responsive to a printed circuit board (PCB) tester activation of a PCB tester interface a start signal indicating that a programmable device is to be programmed, wherein the programmable device is attached to a device under test, and wherein the device under test is detachably mounted on the tester station:
   loading, utilizing an in-system programmer electrically attached to the PCB tester, characterization data onto the programmable device, wherein the characterization data is configured to, when executed on the device under test, cause the device under test to perform one or more functions;

determining whether loading the characterization data onto the programmable device caused the programmable device to be successfully programmed;

in the event that the programmable device is successfully programmed, asserting a PASS line through one or more optical isolators to indicate to an external device that the programmable device was successfully programmed; and in the event that the programmable device is not successfully programmed, asserting a FAIL line through one or more optical isolators to indicate to an external device that the programmable device was not successfully programmed.

2. The method of claim 1, wherein loading the characterization data onto the programmable device comprises utilizing an ISP cable to communicate with the programmable device.

3. The method of claim 1, wherein the in-system programming is configured by:
receiving the characterization data via a network interface; and
writing the characterization data to a memory device on the in-system programmer.

4. The method of claim 3, further comprising configuring an array in the in-system programmer to program multiple instances of the programmable device.

5. A manufacturing test and programming method comprising:
loading characterization data onto programmable device using an in-system programmer, wherein the in-system programmer is:
electrically connected to a PCB tester;
mounted in a tester station; and
configured to communicate with the programmable device via an in-system programmer (ISP) cable, wherein the programmable device is detachably mounted on the tester station;
in the event that loading the characterization data onto the programmable device caused the programmable device to be successfully programmed, asserting a PASS line through one or more optical isolators to indicate to the PCB tester that the programmable device was successfully programmed; and
in the event that loading the characterization data onto the programmable device did not cause the programmable device to be successfully programmed, asserting a FAIL line through one or more optical isolators to indicate to the PCB tester that the programmable device was not successfully programmed.

6. The method of claim 5, further comprising configuring the in-system programmer by:
utilizing a network interface to load the characterization data onto the in-system programmer; and
writing the characterization data to a non-volatile memory device on the in-system programmer.

7. The method of claim 5, further comprising configuring an array of the in-system programmer to program multiple of the same or different instances of the programmable device.

8. The method of claim 5, wherein said asserting the PASS or FAIL line comprises illuminating a light emitting diode to indicate the current status of lines of a PCB tester interface.

9. A manufacturing test and programming system, comprising:
a PCB tester;
an in-system programmer that is part of an array of in-system programmers, wherein the array is configured to program multiple instances of a programmable device, the in-system programmer is configured to be electrically connected to the PCB tester, and the system programmer is configured to:
receive characterization information from the PCB tester via a network interface; store the characterization information on a memory device of the in-system programmer; and
program a programmable device with the characterization information, wherein the programmable device is attached to a device under test; and
a PASS line and a FAIL line, each configured to be asserted through optical isolators to the PCB tester to indicate a programming status of the programmable device.

10. The system of claim 9, further comprising an ISP cable connecting the programmable device to the in-system programmer.

11. The system of claim 9, further comprising:
a tester station, wherein the in-system programmer is configured to be attached to the tester station and the device under test is configured to be detachably mounted to the tester station; and
ISP cable connecting the programmable device to the in-system programmer so that the in-system programmer can program the programmable device.

12. The system of claim 11, wherein the in-system programmer comprises:
a non-volatile memory device configured to write the characterization data to the programmable device.

13. The system of claim 11, further comprising a light emitting diode configured to indicate a current status of lines in a PCB tester interface.

14. An in-system programmer, comprising:
a tester interface configured to receive characterization data from an external PCB tester;
a programmer interface configured to communicate the characterization data from the in-system programmer to a programmable device as part of a programming operation;
a PASS line configured to be asserted in the event that the programming operation is successful;
a FAIL line configured to be asserted in the event that the programming operation is unsuccessful; and
one or more optical isolators configured to communicate programmable device programming status information from the PASS line and the FAIL line to the external PCB tester, wherein the in-system programmer is integrated with a tester station and the programmable device is integrated with a device under test that is configured to be detachably mounted on the tester station, the tester station being configured to allow the device under test to be detached from the tester station and a different device under test to be detachably mounted on the tester station.

15. The in-system programmer of claim 14, wherein the tester interface includes a START signal that, if asserted by the PCB tester, initiates programming of the programmable device with the characterization data.

16. The in-system programmer of claim 14, further comprising an array that is configured to program multiple instances of the programmable device.

* * * * *